(12) United States Patent
Chien et al.

(10) Patent No.: US 6,395,596 B1
(45) Date of Patent: May 28, 2002

(54) METHOD OF FABRICATING A MOS TRANSISTOR IN AN EMBEDDED MEMORY

(75) Inventors: Sun-Chieh Chien; Chien-Li Kuo, both of Hsin-Chu (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/819,751

(22) Filed: Mar. 29, 2001

(51) Int. Cl.[7] ................. H01L 21/8247; H01L 21/8242
(52) U.S. Cl. ........................ 438/241; 438/258
(58) Field of Search ................. 438/241, 258

(56) References Cited

U.S. PATENT DOCUMENTS

| | | | |
|---|---|---|---|
| 6,258,667 B1 | * 7/2001 | Huang | 438/258 |
| 6,284,602 B1 | * 9/2001 | He et al. | 438/258 |
| 6,326,260 B1 | * 12/2001 | Divakaruni et al. | 438/241 |

* cited by examiner

Primary Examiner—Richard Booth
(74) Attorney, Agent, or Firm—Winston Hsu

(57) ABSTRACT

The present invention provides a method of fabricating a MOS transistor in an embedded memory. A first dielectric layer, an undoped polysilicon layer, and a second dielectric layer are formed on the periphery circuits area. Next, the undoped polysilicon layer in the memory array area is doped, followed by removal of the second dielectric layer in the memory array area. Then, a silicide layer and a protective layer are formed and portions of the memory array area are etched to form gates. LDDs in each MOS transistor in the memory array area are formed. Next, LDDs in each MOS transistor in the periphery circuits area are formed. A portion of the silicon nitride layer and the silicon oxide layer in the periphery circuits area form a spacer on either side of each gate in the periphery circuits area. Finally, a source and drain (S/D) are formed in the periphery circuits area.

17 Claims, 9 Drawing Sheets

METHOD OF FABRICATING A MOS TRANSISTOR IN AN EMBEDDED MEMORY

BACKGROUND OF THE INVENTION

1. Field of the Invention

The present invention provides a method of fabricating a MOS transistor in an embedded memory, more particularly, a method of simultaneously forming a periphery circuit region and a memory array area in the embedded memory of the MOS transistor.

2. Description of the Prior Art

Due to the rising integration density of semiconductor processes, the trend has been to integrate both a memory cell array and high-speed logic circuit elements onto a single chip to form an embedded memory. As a result, both a decrease in area occupation and an increase in signalling speed are achieved. The high-speed logic circuit elements mentioned are also referred to as the periphery circuit region. Because of demand for low resistance and high-speed speed MOS transistors formed in the periphery circuits region, a self-alignment silicide (salicide) process is commonly used in the semiconductor process to form a silicide on the surfaces of a gate, source and drain of each MOS transistor in the periphery circuits region. As a result, the interface resistance on the surfaces of the gate, source and drain in each MOS transistor is decreased.

As well, the self-aligned-contact (SAC) process is used to solve the electrical connection problem of the memory cell in the memory array area, whereby a cap layer and a spacer, both composed of silicon nitride, are formed on the sidewall and on the surface of the gate of the pass transistor in the memory array area to function as an isolation mask needed in the subsequent SAC process. Therefore, the problem of the prior art results in the inability to simultaneously perform both the above processes to save production time.

In addition, the spacing between each gate in the memory array area is of closer proximity than in the periphery circuit region, so that the spacer adjacent to each gate in the memory array area is of lesser thickness in order to avoid producing voids in the dielectric layer that fills the area between the word lines. Oppositely, due to electrical requirement, the width of the spacer in the MOS transistor formed in the periphery circuits area is not able to be so close as in the memory array area to let the problems of the integration of both processes happen.

Please refer to FIG. 1 to FIG. 9. FIG. 1 to FIG. 9 are the schematic diagrams of fabricating a MOS transistor on semiconductor wafer 10 of an embedded memory according to the prior art. As shown in FIG. 1, both the memory array area 12 and a periphery circuits area 14 are defined on the surface of a silicon substrate 16 on the semiconductor wafer 10. Several trenches 11 separate each area. A dielectric layer 18, a polysilicon layer 20, and an etching barrier layer 22 are formed, respectively, on the surface of the semiconductor wafer 10. And then shown in FIG. 2, a mask layer 24 is formed on the etching barrier layer 22 in the periphery circuits area 14, followed by the use of an isotropic wet etching process to simultaneously remove both the etching barrier layer 22 and the polysilicon layer 20 in the memory array area 12, down to the surface of the dielectric layer 18.

As shown in FIG. 3, the mask layer 24 on the etching barrier layer 22 is then removed, followed by the removal of the dielectric layer 18 in the memory array area 12 to expose the surface of the silicon substrate 16. As shown in FIG. 4, a dielectric layer 26 functioning as a gate oxide layer is formed on the surface of the exposed silicon base in the memory array area 12. Next, a polysilicon layer 28, a tungsten silicide layer 30, and a silicon nitride layer 32 are formed, respectively, on the surface of the semiconductor wafer 10.

As shown in FIG. 5, a photoresist layer 34 is formed on the silicon nitride layer 32 and the patterns of the gates in both the memory array area 12 and the periphery circuits area 14 are defined by a PEP. Then, the silicon nitride layer 32, the tungsten silicide layer 30, and the polysilicon layer 28 are etched down to the surface of the dielectric layer 26 in the memory array area 12 by using the patterns of the photoresist layer 34 as a hard mask. Concurrently, the silicon nitride layer 32, the tungsten silicide layer 30, and the polysilicon layer 28 are etched down to the surface of the etching barrier layer 22 in-the periphery circuits area 14. As shown in FIG. 6, another photoresist layer 36 is formed in the memory array area 12 after the photoresist layer 34 is removed to cover and protect the gate structure 33 composed of the dielectric layer 26, the polysilicon layer 28, the tungsten silicide layer 30 and the silicon nitride layer 32 in the memory array area 12.

As shown in FIG. 7, the photoresist layer 36 in the memory array area and the silicon nitride layer 32 in the periphery circuits area 14 are used as hard masks, to etch both the etching barrier layer 22 and the polysilicon layer 20 down to the surface of the dielectric layer 18 to form the gate 35 structure in the periphery circuits area 14. Next, the silicon nitride layer 32, the tungsten silicide layer 30, the polysilicon layer 28 and the photoresist layer 36 are removed.

As shown in FIG. 8, lightly doped drains (LDD) 38 in each MOS transistor are formed by performing an ion implantation process. Next, a silicon nitride layer 43 is deposited on the surface of the semiconductor wafer 10, and a spacer 44 is formed on either side of the gate 35 in the periphery circuits area 14 using an anisotropic etching process, and simultaneously, the etching barrier layer 22 on the gate 35 is removed. Then, a source 40 and drain 42 of each MOS transistor are formed in the periphery circuits area 14. Finally, as shown in FIG. 9, a salicide layer 46 is formed on the surface of each source 40, drain 42 and gate 35 using a self-aligned silicide process in the periphery circuits area 14.

However, the prior art method of fabricating a MOS transistor involves a step, as shown in FIG. 7, of removing the silicon nitride layer 32 in the periphery circuits area 14 because the silicon nitride layer 32 is not required in the formation of the gate 35 in the periphery circuits area 14. As well, the spacer 44 in the periphery circuits area 14 shown in FIG. 8 is unable to attain a large enough spacer width to achieve the desired electrical performance.

SUMMARY OF THE INVENTION

It is therefore an objective of the present invention to provide a method of fabricating a MOS transistor in an embedded memory to solve the above-mentioned problems.

In the present invention, a first dielectric layer, an undoped polysilicon layer, and a second dielectric layer are formed, respectively, in both the memory array area and in the periphery circuits area on the surface of a semiconductor wafer. Next, a doped polysilicon layer is formed by doping the undoped polysilicon layer in the memory array area followed by the removal of the second dielectric layer in the memory array area. Then, both a silicide layer and a protective layer are formed, respectively, on the surface of the semiconductor wafer. The protective layer, the silicide layer and the doped polysilicon layer in the memory array area are then etched to form a plurality of gates, and the protective layer and the silicide layer in the periphery circuits area are etched in-situ. Thereafter, lightly doped drains (LDD) of the MOS transistor in the memory array area are formed. Next a portion of the undoped polysilicon layer in the periphery circuits area is etched to form a plurality of gates, followed by the formation of LDDs of each MOS transistor in the periphery circuits area. Then, a silicon nitride layer and acompensated silicon oxide layer are formed, respectively, on the surface of the semiconductor wafer. A portion of the silicon nitride layer and the compensated silicon oxide layer in the periphery circuits area are then etched to form a spacer on either side of each gate in the periphery circuits area. Finally, a source and drain (S/D) in the periphery circuits area are formed using an ion implantation process.

There are two advantages in the present invention. The first advantage is that the process of forming the silicon nitride layer required for the gate in the memory array area, simultaneously removes the silicon nitride layer not needed for the gate in the periphery circuits area to save process time. The second advantage is that a greater spacer width is achieved over that of the prior art to attain better electrical performance.

DETAILED DESCRIPTION OF THE PREFERRED EMBODIMENT

Figure 1:
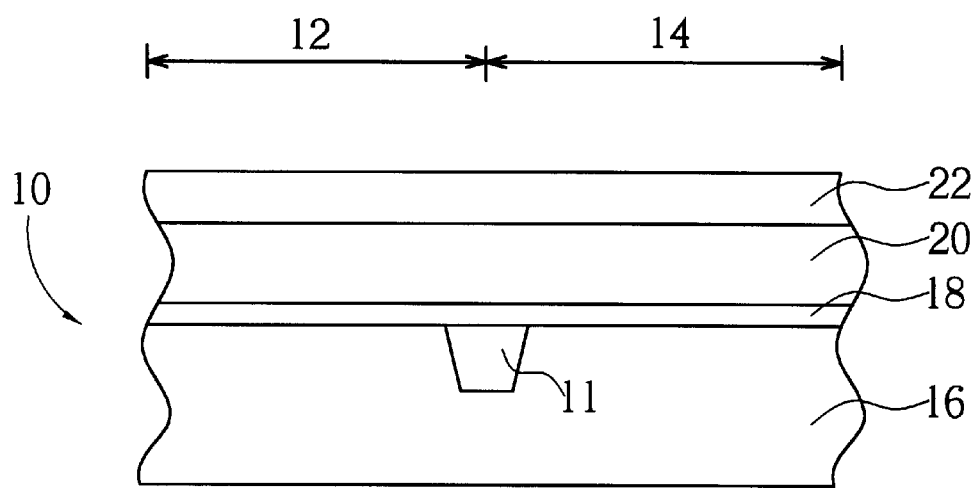
FIG. 1 to FIG. 9 are the schematic diagrams of the fabrication of a MOS transistor in an embedded memory according to the prior art.
Figure 2:
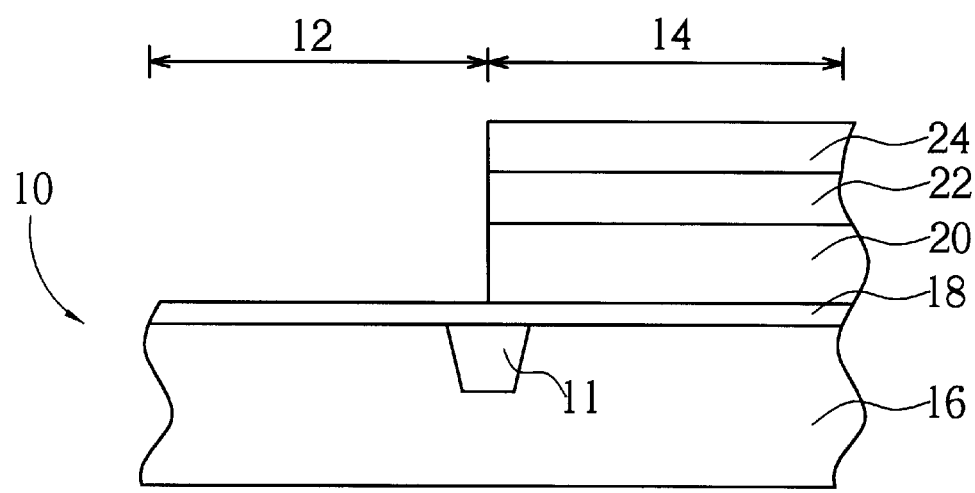
Figure 3:
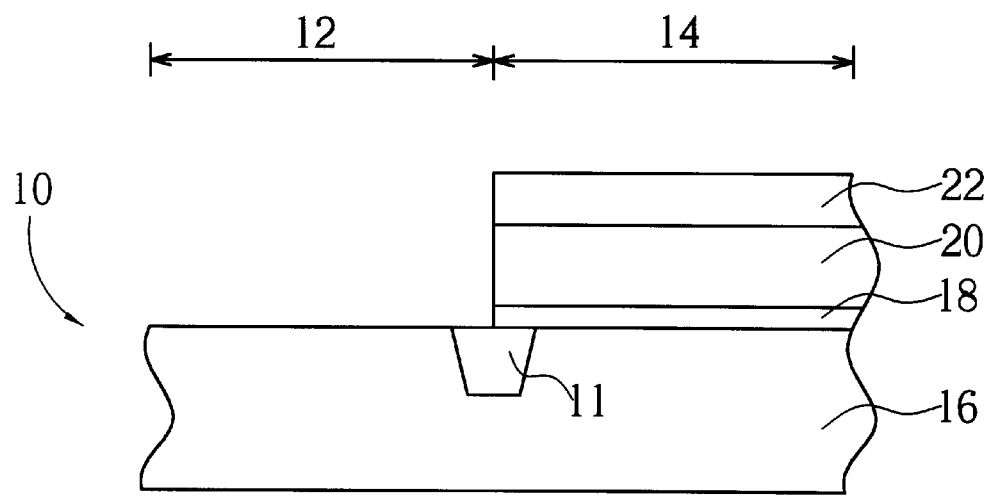
Figure 4:
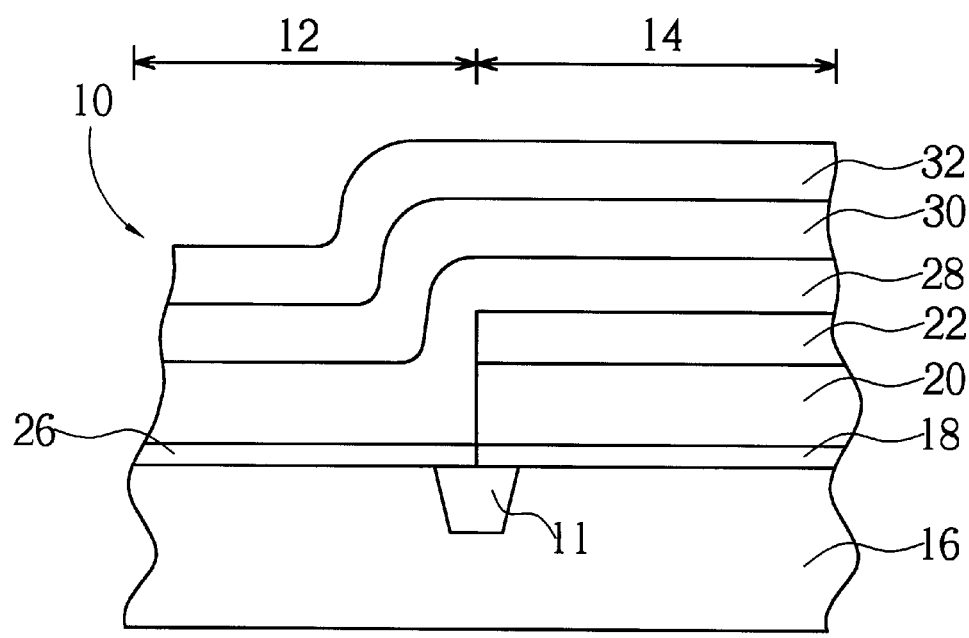
Figure 5:
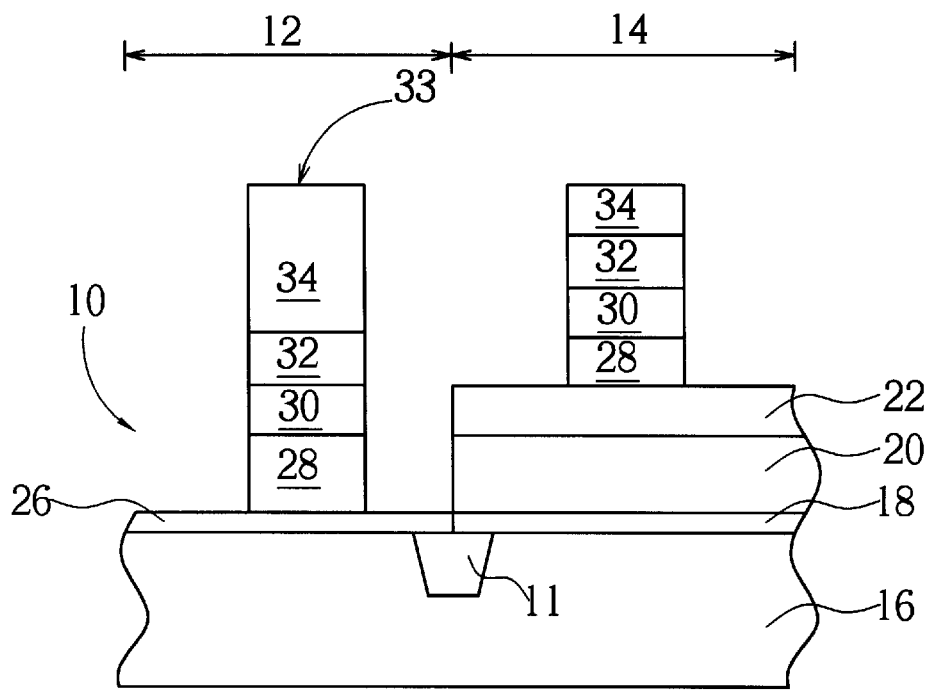
Figure 6:
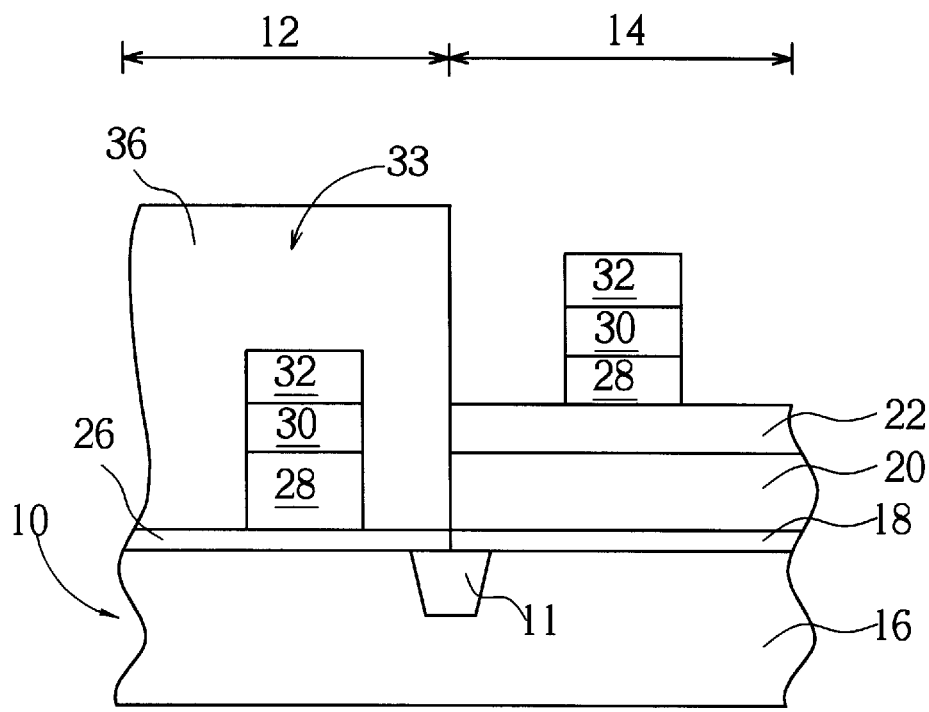
Figure 7:
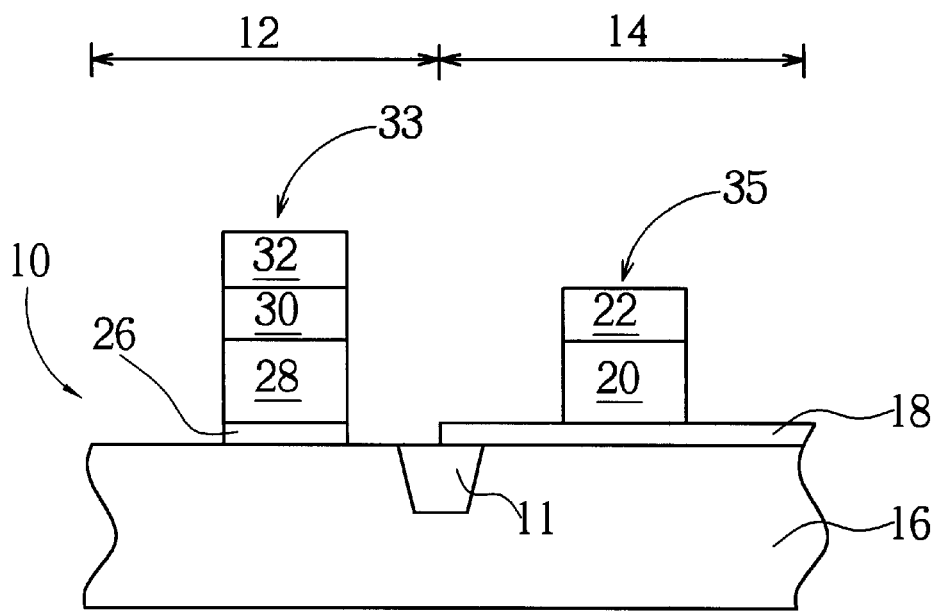
Figure 8:
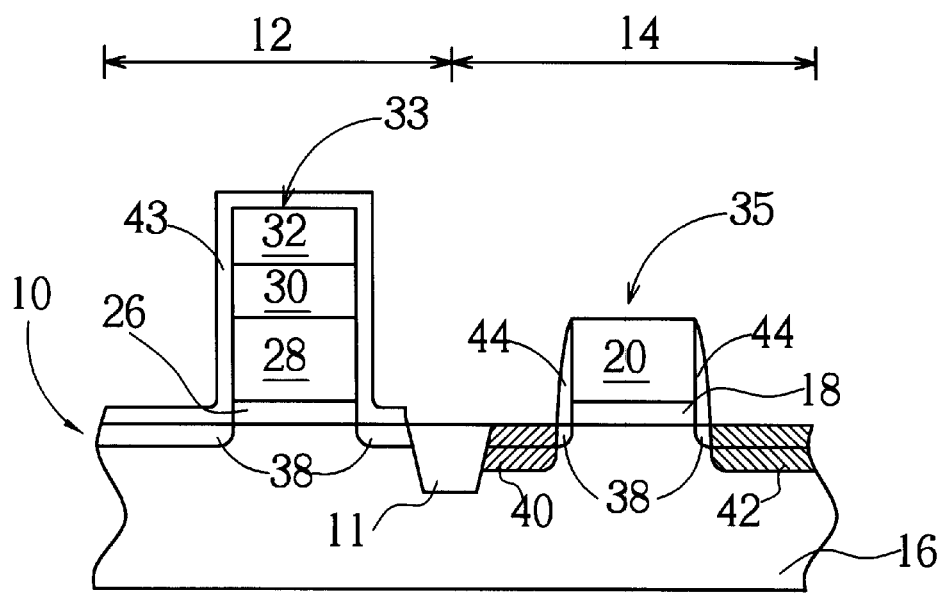
Figure 9:
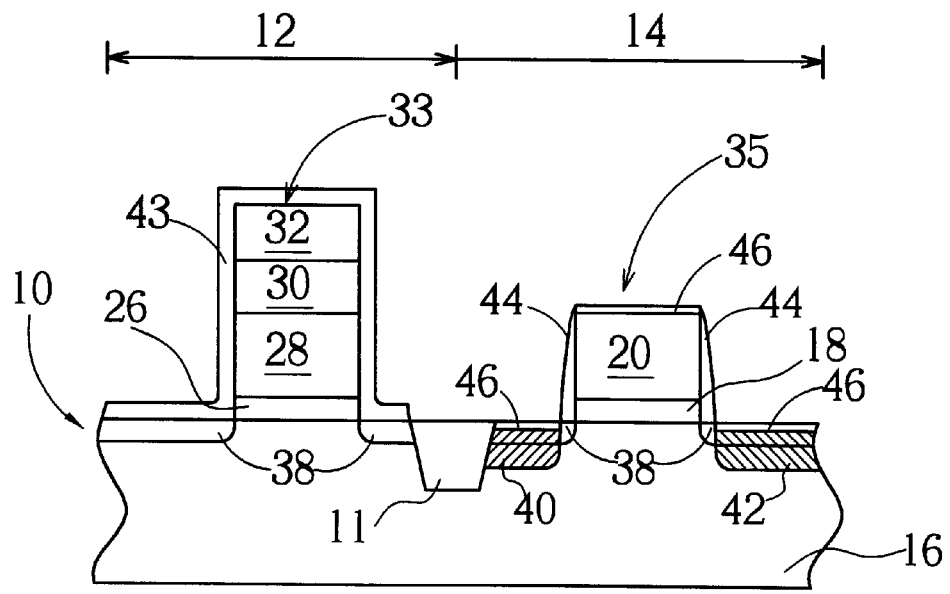
Figure 10:
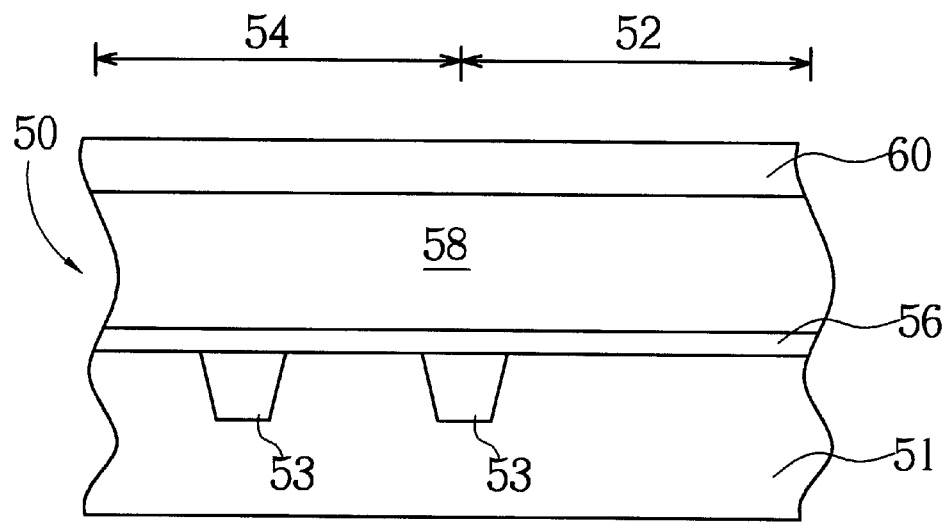
FIG. 10 to FIG. 17 are the schematic diagrams of the fabrication of a MOS transistor in an embedded memory according to the present invention.

Please refer to FIG. 10 to FIG. 18. FIG. 10 to FIG. 18 are the schematic diagrams of the MOS transistor in the embedded memory according to the present invention.: As shown in FIG. 10, the fabrication method of the MOS transistor in the embedded memory first involves defining a memory array area 52, a periphery circuits area 54 and several shallow trench isolations 53 on the surface of a silicon base 51 on the semiconductor wafer 50. Next, a first dielectric layer 56 is formed on the surface of the silicon base 51 using a heat oxide method, followed by the deposition of an undoped polysilicon layer 58 using a low pressure chemical vapor deposition (LPCVD) method. A second dielectric layer 60 is formed on the surface of the undoped polysilicon layer 58 by a heat oxide method or a CVD method. The first dielectric layer 56 is composed of silicon dioxide ($SiO_2$) and functions as an oxide layer in the gate of each MOS transistor, as well as a stop layer in the subsequent etching process.

Figure 11:
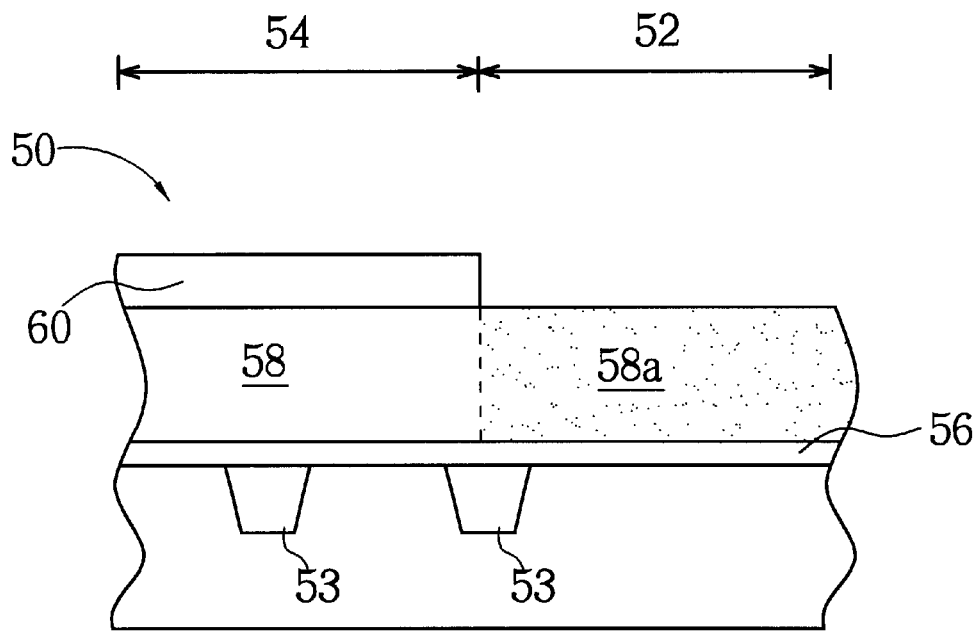

Please refer to FIG. 11. As shown in FIG. 11, a PEP is then performed using a Cell LDD in the pass transistor or the mask of the cell well in the memory array area 52 to perform a first ion implantation process on the undoped polysilicon layer 58 in the memory array area 52 to become a doped polysilicon layer 58a. Next, the second dielectric layer 60 in the memory array area 52 is removed so that the second dielectric layer 60 remains only in the periphery circuits area 54.

Figure 12:
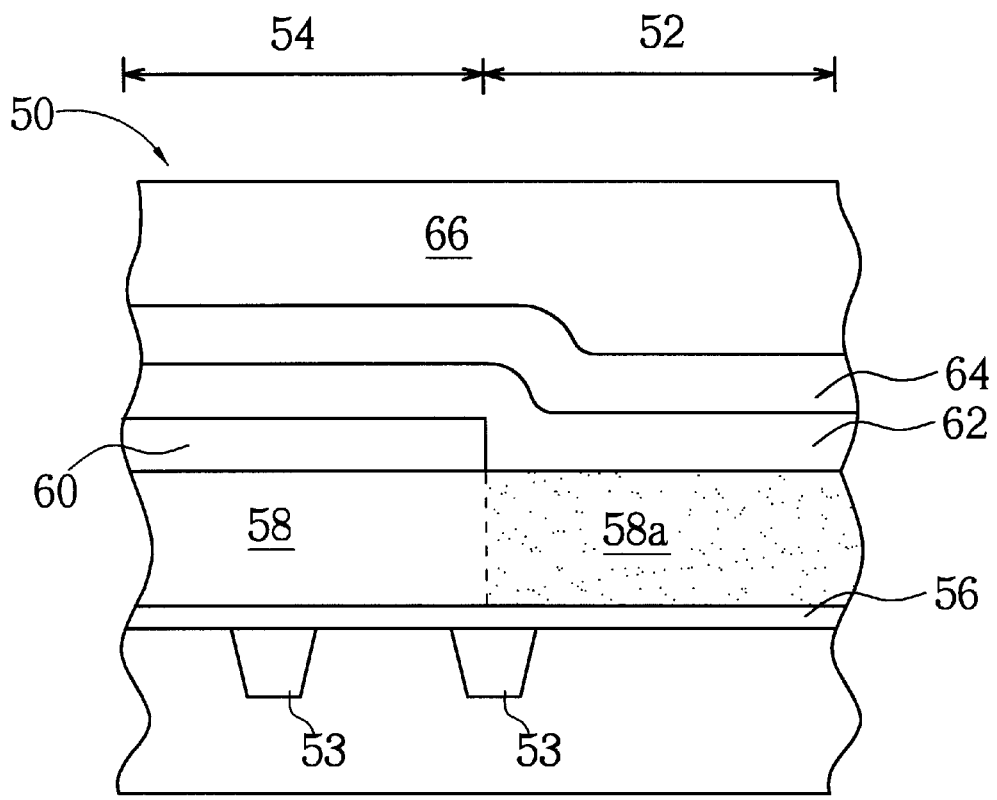
Figure 13:
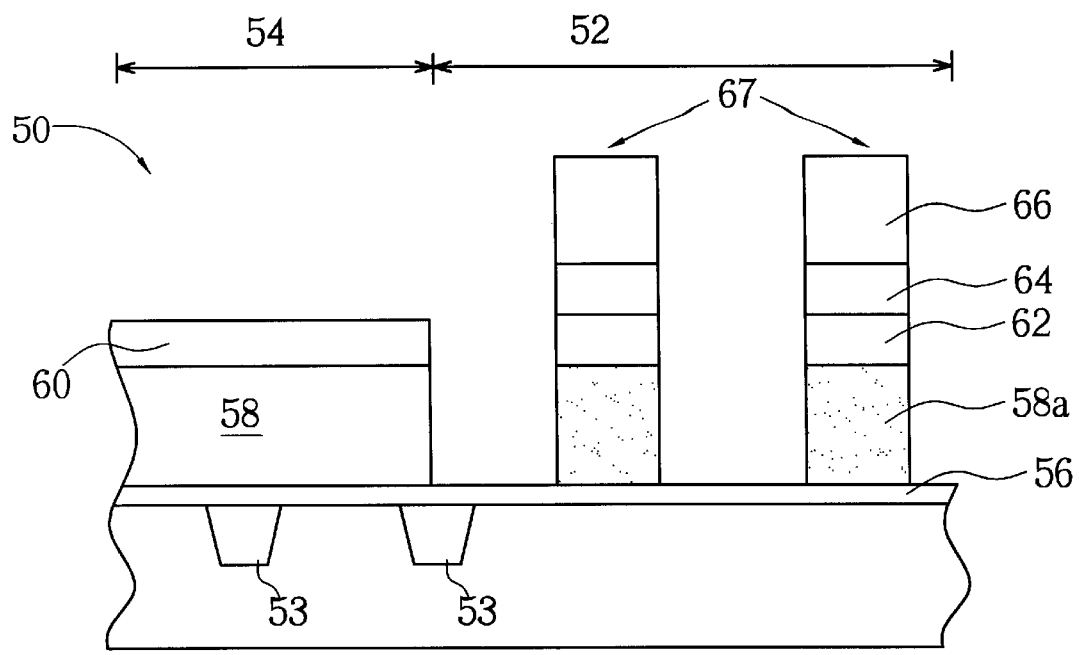

As shown in FIG. 12, a silicide layer 62, a protective layer 64 and a first photoresist layer 66 are then formed, respectively, on the surface of the semiconductor wafer 50. The protective layer 64 is composed of silicon nitride (SiN), and a silicon-oxy-nitride($SiO_xN_y$) layer (not shown) is formed between the protective layer 64 and the silicide layer 62 to function as an anti-reflection-coating(ARC) to prevent light from reflecting off the surface of the silicide layer 62 and affect the exposure accuracy of the photoresist. Both the silicide layer 62 and the doped polysilicon layer 58a are used as electrical conduction layers of the gate in each transistor.

As shown in FIG. 13, a PEP is again performed to define a plurality of the patterns (not shown) of a gate 67 in the first photoresist layer 66 in the memory array area 52. Then, the protective layer 64, the silicide layer 62, and the doped polysilicon layer 58a in the memory array area 52 are etched down to the surface of the first dielectric layer 56 using the patterns of the first photoresist layer 66 as a hard mask. The protective layer 64 and the silicide layer 62 in the periphery circuits area 54 are etched in-situ down to the surface of the second dielectric layer 60. The protective layer 64 is composed of silicon nitride and functions as a cap layer of the gate 67 in the memory array area 52, while the second dielectric layer 60 in the periphery circuits area 54 functions as both an etching barrier layer and a stop layer in the subsequent etching process.

Figure 14:
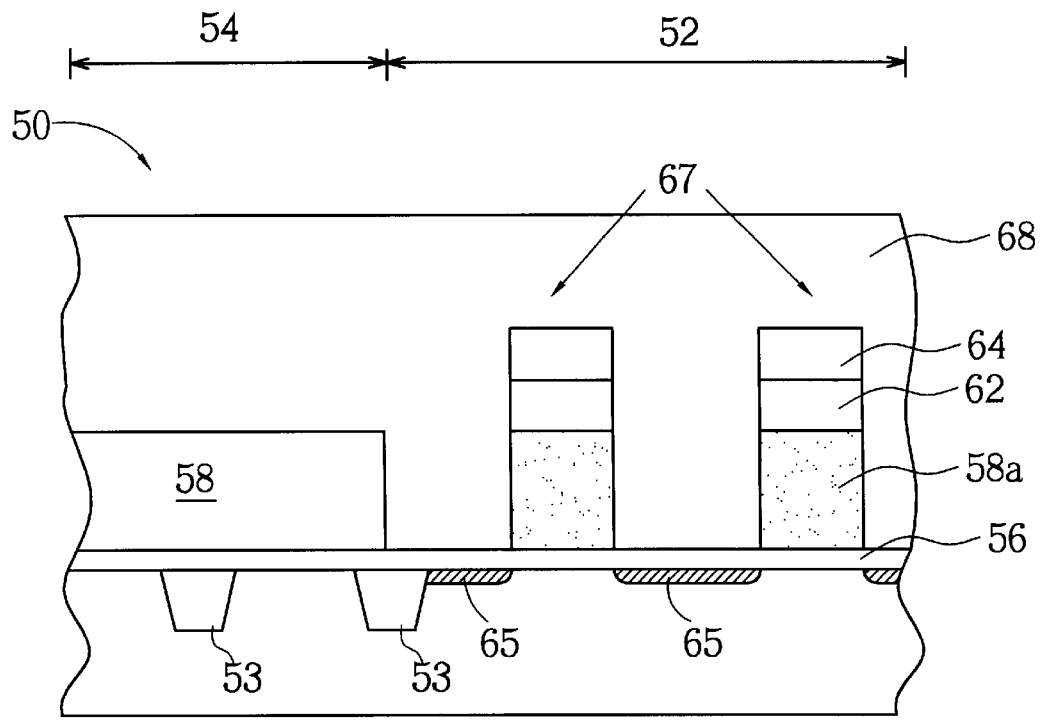

As shown in FIG. 14, an ion implantation process is performed to form lightly doped drains (LDD) 65 in each MOS transistor in the memory array area 52. Then, the first photoresist layer 66 and the second dielectric layer 60 in the periphery circuits area 54 are removed. Next, a second photoresist layer 68 is formed on the surface of the semiconductor wafer 50, whereby a silicon oxide nitride ($SiO_xN_y$) functioning an antireflection layer (not shown) is formed on the semiconductor wafer 50 prior to the formation of the second photoresist layer 68.

Figure 15:
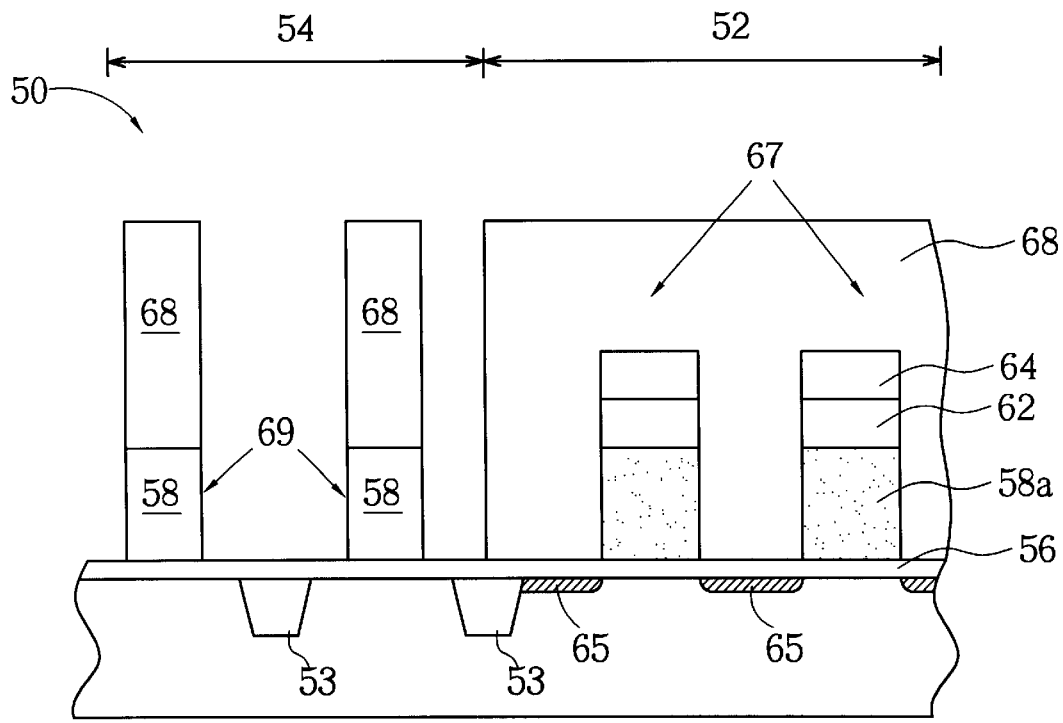

As shown in FIG. 15, a PEP is performed to define a plurality of patterns (not shown) of a gate 69 in the second photoresist layer 68 in the periphery circuits area 54. Next, the undoped polysilicon layer 58 in the periphery circuits area 54 is etched down to the surface of the first dielectric layer 56 using the second photoresist layer 68 as a hard mask. Lightly doped drains (LDD) 65 in each MOS transistor is then formed in the periphery circuits area 54 using an ion implantation process.

Figure 16:
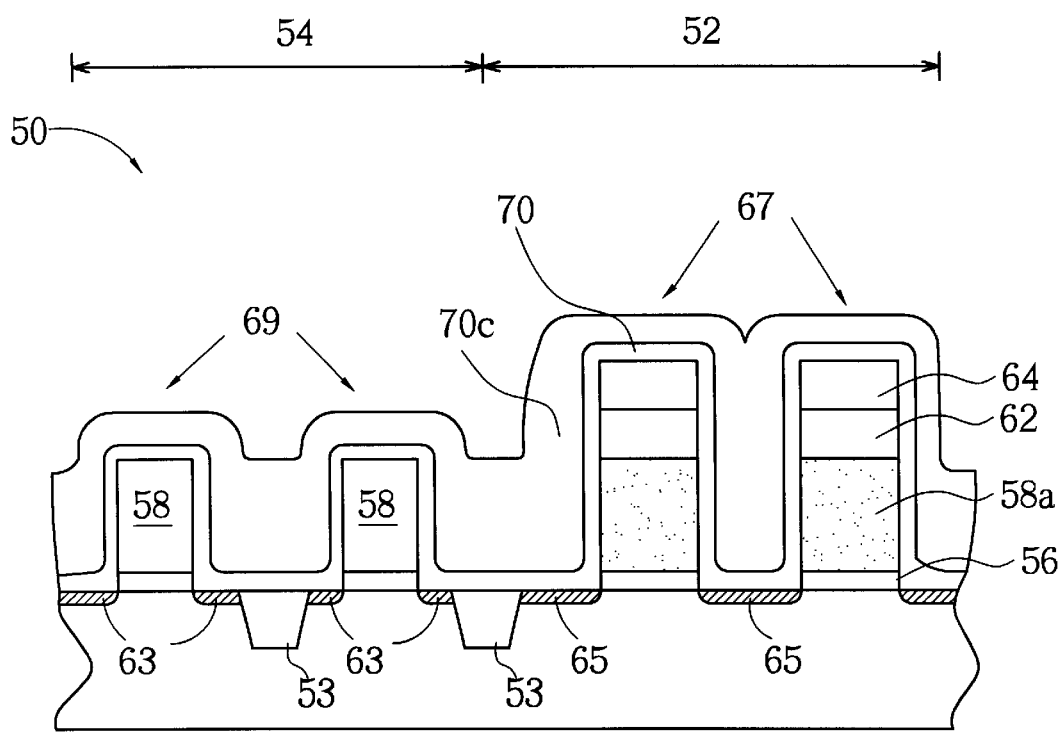

And then as shown in FIG. 16, a silicon nitride layer 70 and a compensated silicon oxide layer 70c are formed, respectively, on the surface of the semiconductor wafer 50 and covering the surface of each gate 67,69 after the removal of the portion of the dielectric layer 56 not covered by each gate 67,69 and the complete removal of the second photoresist layer 68. The thickness of the silicon nitride layer 70 is about 350 angstroms, and the thickness of the silicon oxide layer 70c is about 700 angstroms.

Figure 17:
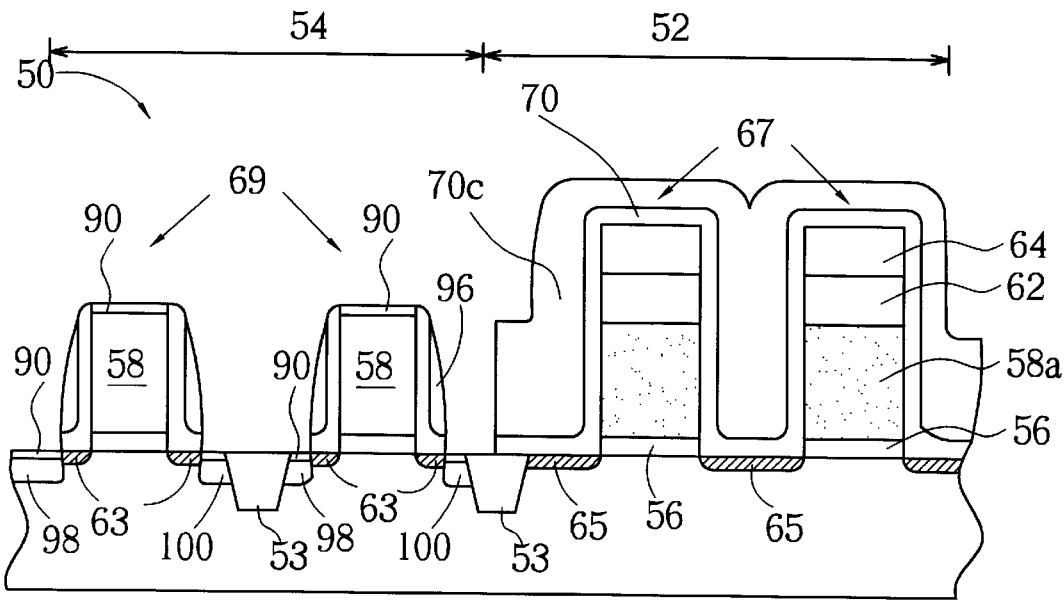

And then as shown in FIG. 17, the patterns of a mask are defined and a PEP is used to etch both the silicon nitride layer 70 and the compensated silicon nitride layer 70c to form a spacer 96 on either side of each gate 69 in the periphery circuits area 54. Thereafter, a source 98 and drain 100 of each MOS transistor are formed in the peripheral circuits area 54 using an ion implantation process.

A metal layer (not shown) composed of cobalt (Co) is formed on the surface of the semiconductor wafer 50 after the formation of the source 98 and drain 100 of each MOS transistor, and covering the surfaces of the source 98, the drain 100, and the gate 69 in the periphery circuits area 64. A first rapid thermal process (RTP) is then performed at a temperature between 400° C. to 600° C. and at a duration of 10 to 50 seconds. As a result, a salicide layer 90 is formed on the surfaces of each source 98, drain 100, and gate 69 in the periphery circuits area 54. Next, the unreacted metal layer is removed by a wet etching process. Finally, a second RPT is performed at a temperature between 600° C. to 800° C. and at a duration of 10 to 50 seconds, so that the $CoSi_2$ of low resistance reacts with the $Co_2Si$ and CoS in the salicide layer 90. Instead of cobalt (Co), the metal layer can also be composed of titanium (Ti), nickel (Ni), or molybdenum (Mo).

The purpose of the step in which the portion of the silicon nitride layer 70 in the periphery circuits area 54 is removed so that the silicon nitride layer 70 remains only in the memory array area 52 is that the gate 67 in the memory array area 52 possesses the protective layer 64 needed in the subsequent self-aligned-contact (SAC) process. Also, the surface of the gate 69 in the periphery circuits area 54 does not require the silicon nitride layer 70, so that a subsequent salicide process can be performed. As well, the wider spacer 96 formed by both the silicon nitride layer 70 and; the compensated silicon oxide layer 70c on either side of each gate 69 avoids the hot carrier effect.

Figure 18:
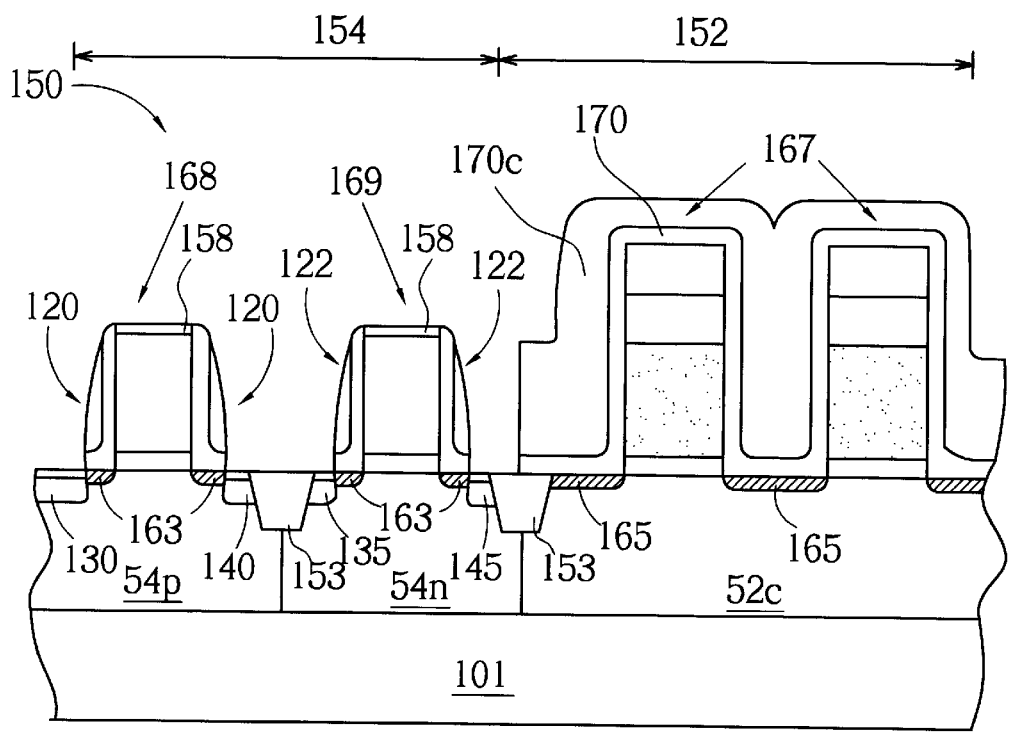
FIG. 18 is the second embodiment of the present invention.

Please refer to FIG. 18 of the second embodiment of the present invention. As shown in FIG. 18, a memory array area 152 and a periphery circuits area 154 are defined on the surface of a silicon base 101 of a semiconductor wafer 150. The memory array area 152 comprises a single cell well 52c and the periphery circuits area 154 comprises an N type well 54n and at least one P type well 54p, with each well separated by several shallow trenches 153.

As shown in FIG. 18, the difference between the fabrication method of the second embodiment and the fabrication method represented in FIG. 10 to FIG. 17 is that the second embodiment integrates the process of the CMOS transistor. Gates 167, 168, 169 and LDDs 163, 165 are formed, respectively, in the semiconductor wafer 150 in the same steps as that represented in FIG. 10 to FIG. 16. Then, the position of the NMOS is defined in the periphery circuits area 154 by performing a PEP, and both the silicon nitride layer 170 and the compensated silicon oxide layer 170c on either side of the gate 168 above the P type well 54p in the periphery circuits area 154 are etched to form spacers 120. A source 130 and drain 140 in the NMOS transistor are then formed in the P type well 54p by performing an ion implantation process. Next, the position of the PMOS is defined in the periphery circuits area 154 by performing a PEP, whereby spacers 122 are formed by etching both the silicon nitride layer 170 and the compensated silicon oxide layer 170c on either side of the gate 169 above the N type well 54n in the periphery circuits area 154. A source 135 and drain 145 in the PMOS transistor are formed in the N type well 54n by performing an ion implantation. Finally, an undoped polysilicon layer 158 on each gate 168, 169 above the P type well 54p and N type well 54n is separately doped using an ion implantation process.

In the present invention, the method of fabricating a MOS transistor first involves the formation of the LDD and each gate on the surface of the semiconductor wafer, followed by the formation of a silicon nitride layer and a compensated silicon oxide layer, respectively, on the surface of the semiconductor wafer and covering each gate. Finally, a wider spacer on either side of each gate in the periphery circuits area is formed by etching both the silicon nitride layer and the compensated silicon oxide layer in the periphery circuits area.

In comparison with the prior art, the fabrication method of a MOS transistor in an embedded memory according to the present invention has the advantage of simultaneously forming a gate with a cap layer and a gate without cap layer to separately complete the salicide process for each MOS transistor in the periphery circuits area and the SAC process for pass transistor in the memory array area. As well, better electrical performance is achieved in the present invention due to the increase in the width of the spacer.

Those skilled in the art will readily observe that numerous modifications and alterations of the device may be made while retaining the teachings of the invention. Accordingly, the above disclosure should be construed as limited only by the meters and bounds of the appended claims.

What is claimed is:

1. A method of fabricating a metal oxide semiconductor (MOS) transistor in an embedded memory, the method comprising:

providing a semiconductor wafer with a defined memory array area and a periphery circuits area on the surface of a silicon substrate on the semiconductor wafer;

forming a first dielectric layer, an undoped polysilicon layer, and a second dielectric layer on the surface of the semiconductor wafer, respectively;

performing a first ion implantation process on the undoped polysilicon layer in the memory array area to transform the undoped polysilicon layer in the memory array are to a doped polysilicon layer;

performing an etching process to completely remove the second dielectric layer in the memory array area;

forming a silicide layer, a protective layer, and a first photoresist layer, respectively, on the surface of the semiconductor wafer;

performing a first PEP to define a plurality of gate patterns in the first photoresist layer in the memory array area;

etching the protective layer, the silicide layer, and the doped polysilicon layer in the memory array area down to the surface of the first dielectric layer using the patterns of the first photoresist layer as a hard mask, and etching in-situ the protective layer and the silicide layer in the periphery circuits area down to the surface of the second dielectric layer;

performing a second ion implantation process to form lightly doped drains (LDD) of each MOS transistor in the memory array area;

removing the first photoresist layer and the second dielectric layer in the periphery circuits area;

forming a second photoresist layer on the surface of the semiconductor wafer;

performing a second PEP to define a plurality of gate patterns in the second photoresist layer in the periphery circuits area;

etching the undoped polysilicon layer in the periphery circuits area down to the surface of the first dielectric layer using the second photoresist layer as a hard mask, to form a gate in each MOS transistor in the periphery circuits area;

performing a third ion implantation process to form LDDs in each MOS transistor in the periphery circuits area;

removing the second photoresist layer;

forming both a silicon nitride layer and a compensated silicon oxide layer on the surface of the semiconductor wafer, respectively, and covering the surface of each gate;

removing portions of both the silicon nitride layer and the compensated silicon oxide layer in the periphery circuits area using an etching process, to form a spacer on either side of each gate in the periphery circuits area; and performing a fourth ion implantation process to form a source and drain in each MOS transistor in the periphery circuits area, and simultaneously doping the undoped polysilicon layer in each gate in the MOS transistor in the periphery circuits area.

2. The method of claim 1 wherein the first dielectric layer is composed of silicon dioxide ($SiO_2$) and functions as a gate oxide layer in each MOS transistor.

3. The method of claim 1 wherein the protective layer is composed of silicon nitride and a first silicon oxide nitride layer ($SiO_xN_y$), functioning as an anti-reflection coating (ARC) is deposited between the protective layer and the silicide layer.

4. The method of claim 1 wherein the second silicon oxide nitride layer ($SiO_xN_y$), functioning as an ARC, is formed on the surface of the semiconductor wafer prior to the formation of the second photoresist layer.

5. The method of claim 4 wherein the second silicon oxide nitride layer underneath the second photoresist layer is removed following the removal of the second photoresist layer.

6. The method of claim 1 wherein the source and drain in each MOS transistor in the periphery circuits area are formed, the steps comprising:

forming a metal layer on the surface of the semiconductor wafer and covering the surfaces of the source, drain, and gate in the periphery circuits area;

performing a first rapid thermal process (RTP);

performing a wet etch to remove the unreacted metal layer from the surface of the semiconductor wafer; and performing a second RTP.

7. The method of claim 6 wherein the metal layer is composed of cobalt(Co), titanium(Ti), nickel(Ni), or molybdenum(Mo).

8. The method of claim 6 wherein the temperature of the first RTP is between 400° C. to 600° C. at a duration of 10 to 50 seconds, and the temperature of the second RTP is between 600° C. to 800° C. at a duration of 10 to 50 seconds.

9. A method of fabricating a MOS transistor in an embedded memory, the method comprising:

providing a semiconductor wafer with a defined memory array area and a periphery circuits area, the memory array area comprising a single cell-well and the periphery circuits area comprising an N-well and a P-well;

forming a first dielectric layer, an undoped polysilicon layer, and a second dielectric layer, respectively, on the surface of the semiconductor wafer;

performing a first ion implantation process on the undoped polysilicon layer in the memory array area to transform the undoped polysilicon layer in the memory array area to a doped polysilicon layer;

performing an etching process to completely remove the second dielectric layer in the memory array area;

forming a silicide layer, a protective layer, and a first photoresist layer, respectively, on the surface of the semiconductor wafer;

performing a first PEP to define a plurality of gate patterns in the first photoresist layer above the single cell well in the memory array area;

using the patterns of the first photoresist layer as a hardmask to etch the protective layer, the silicide layer, and the doped polysilicon layer in the memory array area and to etch in-situ the protective layer and the silicide layer in the periphery circuits area down to the surface of the second dielectric layer;

removing the first photoresist layer;

performing a second ion implantation process to form LDDs in each MOS transistor in the memory array area;

removing the second dielectric layer on the periphery circuits area;

forming a second photoresist layer on the surface of the semiconductor wafer;

performing a second PEP to define a plurality of gate patterns in the second photoresist layer above both the N well and the P well in the periphery circuits area;

using the patterns of the second photoresist layer as a hard mask to etch the undoped polysilicon layer in the periphery circuits area down to the surface of the first dielectric layer, to form a gate in each MOS transistor in the periphery circuits area;

removing the second photoresist layer;

performing a third ion implantation process to form LDDs in each MOS transistor in the periphery circuits area;

forming both a silicon nitride layer and a compensated silicon oxide layer on the surface of the semiconductor wafer and covering the surface of each gate;

etching both the silicon nitride layer and the compensated silicon oxide layer on either side of each gate above the P well in the periphery circuits area to form a spacer and performing a fourth ion implantation process to form a source and drain in the NMOS transistor in the P well; and etching both the silicon nitride layer and the compensated silicon oxide layer on either side of each gate above the N well in the periphery circuits area to form a second spacer and performing a fifth ion implantation process to form a source and drain in a PMOS transistor in the N well.

10. The method of claim 9 wherein the first dielectric layer is composed of silicon dioxide ($SiO_2$) and functions as a gate oxide layer of each MOS transistor.

11. The method of claim 9 wherein the protective layer is composed of silicon nitride and the first silicon oxide nitride layer ($SiO_xN_y$), functioning as an ARC, is deposited between the protective layer and the silicide layer.

12. The method of claim 9 wherein the second silicon oxide nitride layer ($SiO_xN_y$), functioning as an ARC, is formed on the surface of the semiconductor wafer prior to the formation of the second photoresist layer.

13. The method of claim 12 wherein the second silicon oxide nitride layer formed below the second photo-resist layer is removed after the second photo-resist layer is removed.

14. The method of claim 9 wherein the undoped polysilicon layer in each gate above both the P well and N well are separately doped in a fourth and fifth ion implantation process, respectively.

15. The method of claim 9 wherein the source and drain in each MOS transistor in the periphery circuits area are formed, the steps comprising:

forming a metal layer on the surface of the semiconductor wafer, and covering the surfaces of the source, drain, and gate in the periphery circuits area;

performing a first RTP;

performing a wet etch to remove the unreacted metal layer from the surface of the semiconductor wafer; and performing a second RTP.

16. The method of claim 15 wherein the metal layer is composed of cobalt (Co), titanium (Ti), nickel (Ni) or molybdenum (Mo).

17. The method of claim 15 wherein the temperature of the first RTP is between 400° C. to 600° C. at a duration of 10 to 50 seconds, and the temperature of the second RTP is between 600° C. to 800° C. at a duration of 10 to 50 seconds.

* * * * *